United States Patent [19]

Bogner

[11] 4,396,795
[45] Aug. 2, 1983

[54] NON-CONTACTING RF SHIELDING GASKET WITH MOLDED STUB MEMBERS

[75] Inventor: Bruce F. Bogner, Mt. Holly, N.J.

[73] Assignee: RCA Corporation, New York, N.Y.

[21] Appl. No.: 279,188

[22] Filed: Jun. 30, 1981

[51] Int. Cl.$^3$ .............................................. H05K 9/00
[52] U.S. Cl. ............................... 174/35 GC; 361/424
[58] Field of Search .......... 174/35 R, 35 GC, 35 MS; 361/424; 455/300, 301; 219/10.55 D; 334/85

[56] References Cited

U.S. PATENT DOCUMENTS

| | | | |
|---|---|---|---|
| 2,317,813 | 4/1943 | Schoenborn | 174/35 |
| 2,604,507 | 7/1952 | Tyson | 174/35 |
| 2,825,042 | 2/1958 | Tollefson et al. | 174/35 GC X |
| 4,347,420 | 8/1982 | Ikeda et al. | 174/35 GC X |

Primary Examiner—A. T. Grimley
Assistant Examiner—D. A. Tone
Attorney, Agent, or Firm—E. M. Whitacre; J. S. Tripoli; W. H. Meise

[57] ABSTRACT

An RF shielding gasket is provided for establishing low impedance paths, in a given frequency range, in the interface area between two conductive surfaces. The gasket includes a first and second plurality of stubs. The stubs are joined to one another by a conductive member. The stubs are open circuited at one end and connected to the conductive member on the other end. Each stub is folded back upon itself between the two ends. In the interface area, portions of each of the conductive surfaces function as ground planes and a first and second plurality of microstrip lines are thus provided. The open circuits are transformed into low impedance paths, in the frequency range of interest, between the second end of the stubs and the portions of the first and second conductive surfaces. In one embodiment, the stubs and conductive member are formed into a substantial U-shape with a resilient core in the central volume to form a compact RF gasket.

10 Claims, 9 Drawing Figures

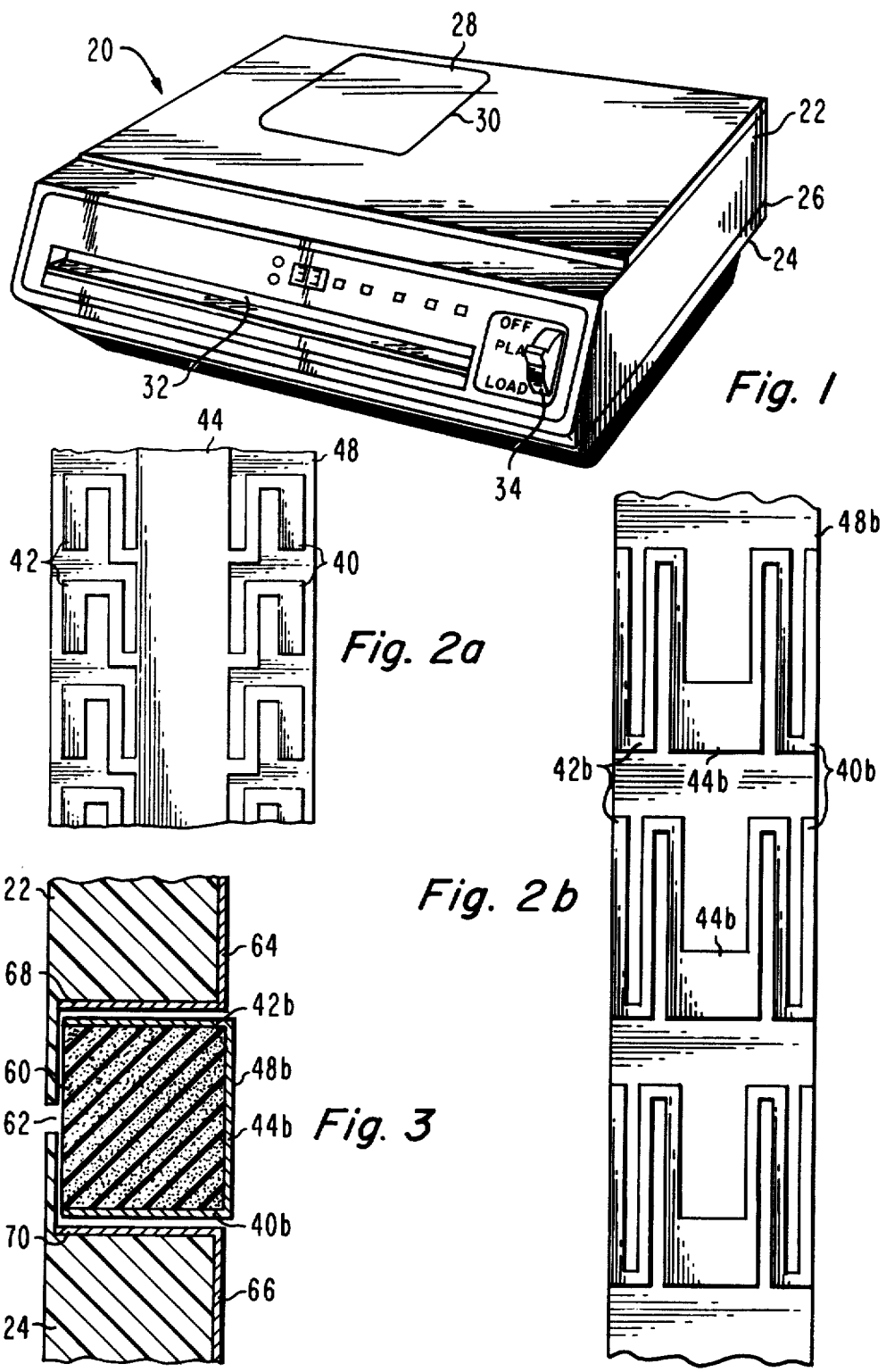

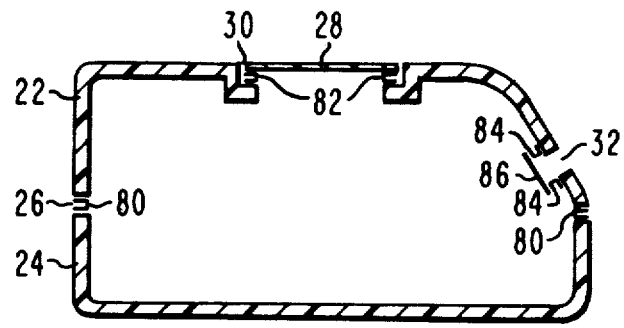
*Fig. 4*
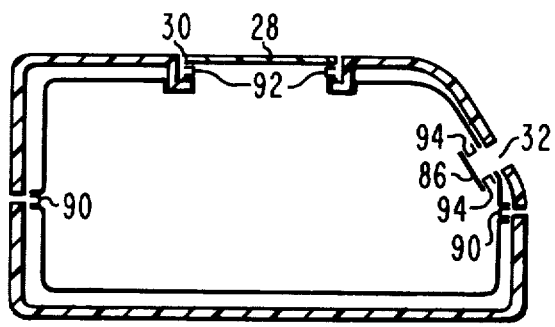
*Fig. 5*
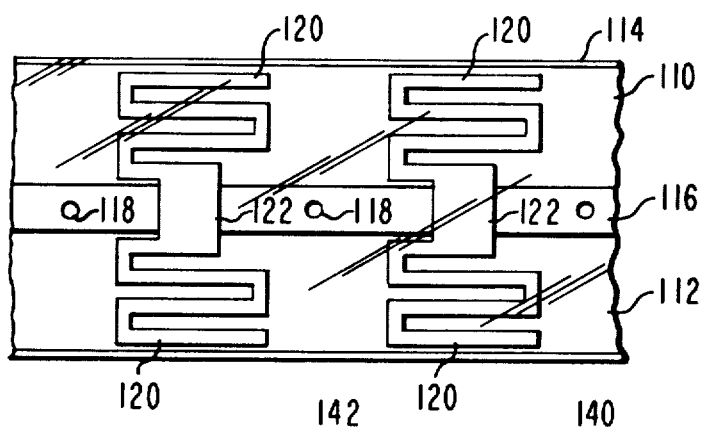
*Fig. 6*
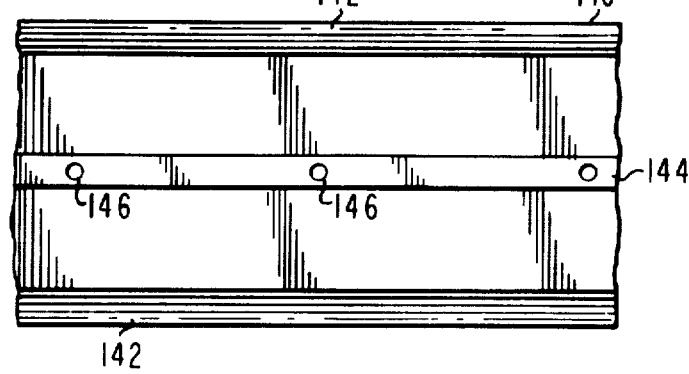
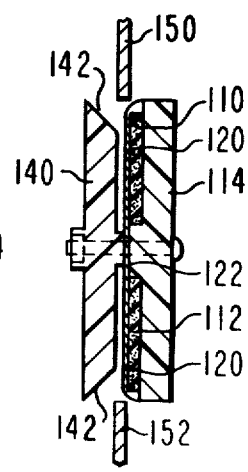
*Fig. 7*   *Fig. 8*

NON-CONTACTING RF SHIELDING GASKET WITH MOLDED STUB MEMBERS

The present invention relates generally to RF shielding apparatus and more particularly to a device for providing improved shielding at the junction between two conductive surfaces without direct electrical contact therebetween.

There are many applications where it is desirable to provide RF shielding either to prevent RF radiation from leaking out, or, by the principle of reciprocity, to prevent interference from external RF radiation. Examples of such applications are radio receivers, microwave ovens, X-ray equipment and certain types of video disc players. In describing the preferred embodiment for practicing the present invention, a video disc player will be used as the example, but, it will be understood that the principles and advantages of the present invention will be applicable to a number of other devices.

In the pickup circuitry for certain capacitive type video disc systems, such as described in U.S. Pat. No. 3,842,194 issued to Clemens, an oscillator is used to drive a tuned circuit, one component of which is the variable capacitance formed between an electrode on a stylus and a conductive property of the playback disc. This oscillator provides a signal at 915 MHz. An example of such pickup circuitry may be found with reference to U.S. Pat. No. 4,080,625 issued to Kawamoto. In the United States this frequency is within the ISM (Industrial, Scientific, Medical) band which has been designated for such equipment. There are standards set for the amount of RF radiation allowed from such equipment to insure that other devices in the area do not experience interference from RF signals generated in the given equipment.

In other countries of the world, notably in Europe, designated frequency bands for certain classes of equipment may not exist. Therefore, to cope with potential RF interference, these countries simply set very stringent requirements for the maximum allowable RF radiation from devices such as video disc players. Thus the problem arises as to the manner in which these stringent requirements can be met.

It is well known in the art that RF radiation may be substantially reduced by enclosing equipment with the potential for radiation (or, by reciprocity, the susceptibility to RF interference) in a conductive enclosure. In the case of a video disc player this may be accomplished by providing an inner metal box surrounded by a decorative outer shell, or, by coating the inside surfaces of the decorative shell with a conductive material.

Despite such an approach, a problem still exists in trying to meet stringent RF radiation standards. The video disc player shell is typically manufactured in two parts, an upper part and a lower part. In addition, a cover or lid is provided in the upper part to provide access to a carriage which houses a replaceable stylus cartridge. It has been found that even with the use of inner metal boxes or conductive inner surfaces, RF leakage still occurs at the seam separating the upper and lower parts as well as the seam around the cartridge access cover in the upper part.

It is known in the art that leakage (or susceptibility) at such seams can be reduced by providing direct electrically conductive contact between the two conductive surfaces. Typically, this can be achieved through the use of conductive fingers which are often spring loaded to provide good electrical contact. An example of such an arrangement may be found in U.S. Pat. No. 2,317,813 issued to Schoenborn. Another approach toward sealing off RF radiation at seams may be found in U.S. Pat. No. 2,604,507 issued to Tyson where a metal gasket having pointed edges is used at a seam. In both cases, a reasonable amount of force must be used on the surfaces to be RF shielded to be sure that good electrical contact is obtained.

The problem with such arrangements is that they are costly, they often involve dissimilar metals which can lead to corrosion and the force required to give good contact often results in deformation of the apparatus providing the RF seal. Spring fingers may be bent and metal gaskets may lose their desired shape after repeated assembly and disassembly of the equipment. In addition, consumer access to inner conductive surfaces represents a potential shock hazard.

In an application filed for O. M. Woodward concurrently with the present application, an invention is disclosed for reducing RF energy flow at the interface area of two conductive surfaces without a direct electrical contact therebetween. The apparatus for accomplishing this result as taught by Woodward comprises a plurality of elongated conductive stub-like members located in the interface area. One end of each of the stubs is connected to a conductive member. The other end of each stub forms an open circuit. A means is provided for spacing at least a portion of one of the conductive surfaces in parallel relationship to the stubs. The stubs and the portion of one of the conductive surfaces form a plurality of microstrip lines. The stubs are dimensioned such that the open circuits are transformed or reflected back at the other end of the stub as a low impedance path in the frequency range of interest. The low impedance paths are then formed between the stubs and the portion of one of the conductive surfaces. A means is provided for coupling the conductive member to the other conductive surface. In this manner a plurality of low impedance paths, in the frequency range of interest, are formed in the interface area between the two conductive surfaces. The "slots" formed by the adjacent low impedance paths are much smaller than a quarter wavelength at the frequency of interest and thus exhibit a very low radiation characteristic.

The present invention provides an improvement over the Woodward approach by providing an RF gasket having the stub-like members in a folded configuration. As a result of folding these stub-like members it has become possible to increase the packing density of the low impedance paths. Thus, as a direct result of this improvement it is possible to increase the number of low impedance paths along a seam and therefore greatly shorten the "slots" created which ultimately results in improved attenuation of energy in the frequency range of interest which would otherwise propagate through the seams or interface area between two conductive surfaces.

In one embodiment of the present invention, the microstrip lines are formed from conductive material positioned on a thin, elongated dielectric member which is arranged in a substantial U-shape. The gasket in this embodiment may include a resilient member in the inside volume of the U-shaped device.

In the drawing:

FIG. 1 is a perspective view of a video disc player which utilizes the apparatus of the present invention;

FIGS. 2a and 2b are sketches of folded back stubs which are useful in the practice of the present invention;

FIG. 3 is a diagram of the interface area between two conductive surfaces of the player of FIG. 1;

FIG. 4 is a cross section of the player of FIG. 1;

FIG. 5 is a cross section of a different approach to shielding the player of FIG. 1; and FIGS. 6–8 show another embodiment of an RF gasket in accordance with the present invention.

Referring now to FIG. 1, video disc player 20 comprises an upper portion 22 and a lower portion 24. The inner surfaces of both the upper and lower portions of the player are coated with a material having conductive particles so as to create a substantially enclosed conductive housing for the player electronics which includes an oscillator providing a signal at 915 MHz. The upper and lower portions 22 and 24 are joined at the seam 26 which goes all the way around the player. In the alternative, there can be a conductive box inside of the decorative shell of player 20 which would have corresponding seams and openings.

Also shown in FIG. 1 is the cartridge access cover or lid 28. When cover 28 is raised or removed, a carriage is exposed which carries the replaceable stylus cartridge. In a player where there is concern about RF radiation, the cover 28 has at least its inner surface made conductive as by the use of conductive paint. The seam 30 represents the interface between the top of portion 22 and the cover 28.

The player 20 also includes an opening 32 which is provided so that a caddy enclosing record may be inserted into the player to load a record. When the record is loaded and the function lever 34 is moved from the load position to the play position, a door (not shown) inside of the player is moved to close off the opening 32. It is desirable to provide some shielding apparatus in addition to the door in the area of opening 32.

The benefits and advantages of the present invention will be discussed in connection with the seams 26 and 30 shown in FIG. 1 and the metal access door shown elsewhere. Again, one benefit of the present invention is the ability to provide a plurality of substantially short circuits at a given frequency, e.g., 915 MHz, around seams 26 and 30 without direct physical contact being made between the two conductive surfaces of interest. In actual practice of the invention, the short circuits, or, at least low impedance paths, are effective over a band of frequencies centered about 915 MHz.

FIG. 2a shows one configuration for forming a first and second plurality of stubs 40 and 42. Stubs 40 and 42 are flat, elongated conductive members, each of which have one end forming an open circuit and have the other end connected to a common conductive member 44. Conductors 40, 42 and 44 are positioned on a thin, elongated dielectric member 48.

The composite structure shown in FIG. 2a may be readily produced using photo etching techniques. Copper is first joined to the dielectric which may be a plastic strip such as Mylar about three-eighths of an inch wide and approximately 0.001 inches in thickness. A photo resist is then used to cover the copper pattern which is to remain. The structure is then exposed to remove the unwanted portions of the copper conductor and, after washing, the composite structure of FIG. 2a is left. The stubs 40 and 42 are symmetrically disposed about an axis along the center line of member 44 for ease of manufacture.

The stubs 40 and 42 are dimensioned to optimize the number of stubs along each side of common conductive connecting member 44 and the RF characteristics of the eventual microstrip lines. For example, the width of the stub section extending perpendicularly from conductor 44, and the second section parallel to the long edge of 44, and the third section perpendicular to the second are all of equal width to provide one characteristic impedance while the fourth connected section has a greater width than the first three to provide another characteristic impedance.

Consider now an infinite ground plane being placed behind the composite structure of FIG. 2a such that the Mylar (polyethylene terephthalate) dielectric acts as a spacer between the conductors 40, 42 and 44 and the ground plane. The dimensions of the stubs are such that in the frequency range of interest, say 900 MHz to 930 MHz, there is a frequency, e.g., 915 MHz where the open circuits at the end of the stubs reflect back or are transformed as short circuits or low impedance paths between the ground plane and the ends of the stubs in the vicinity of the connection to conductor 44. Typically, the overall electrical length of the stubs would be about a quarter wavelength from end to end at 915 MHz to produce this transformation. Electrically the stub length could be any odd multiple of a quarter wavelength at the center frequency. However, the longer the stubs becomes, the less effective and more narrow band it would become. In actual practice this length may be shortened so that the individual microstrip lines are slightly capacitive to balance out any tendency toward inductive loading at the junction of the stubs and the conductor 44.

FIG. 2b shows another embodiment of the composite stub structure for the video disc player application. Here, each of the stubs 40a and 42b are of equal width and equal length. In addition stubs 40b and 42b have been folded back to form three main elongated sections from the open circuited end to the conductive member 44b. This arrangement permits even tighter packing of stubs compared to FIG. 2a so that even more low impedance paths per unit length are created.

Note, in FIG. 2b, that the conductive members 44b are separated from one another on the Mylar dielectric strip. The inter-stub space may now be used for positioning fasteners, or the like for providing mechanical connection of the two conductive surfaces forming the seam, or, the inter-stub area can be used for posts to position the gasket along the seam.

In the case of FIG. 2b, good results have been achieved using 0.001 inch thick Mylar with approximately 0.0007 inch thick copper conductors. The copper stub paths are 0.020 inches wide with 0.020 inch spacing between the elongated sections. The longest dimension of one stub section is about 0.75 inches and the stub to stub spacing is about 0.50 inches.

Each of the conductive members 44b which joins corresponding ones of the stubs 40b and 42b forms a low impedance path therebetween in the frequency range of interest.

The composite structure of FIG. 2b is then folded to form a substantial U-like shape as shown in FIG. 3. A resilient member 60 is placed in the central volume of the U-shape. The elongated resilient member 60 may be formed from a material such as flame retardant neoprene foam. The composite structure comprising the dielectric 48b and the conductors 40b, 42b, and 44b are fixed to the resilient member 60 with an adhesive with the conductors 40b, 42b and 44b on the inside of the U-shape and the dielectric on the outside of the U-shape.

This structure is now brought into the interface area 62 between the upper portion 22 and the lower portion 24 of the player of FIG. 1. Portions 22 and 24 are formed from a material such as Noryl (a blend of polyphenylene oxide and polystyrene) and have their inner surfaces covered with a conductive material to form conductive surfaces 64, 68 and 66, 70 respectively. The RF gasket device is in place all the way around the seam 26 except in the corners. The present gasket allows slots in the seams shorter than an eighth of a wavelength (1.6 inches at 915 MHz). Thus, only the long straight edges require gasketing.

When the upper portion 22 of the player 20 is placed on the lower portion 24 the resiliency of member 60 permits the gasket to fill the interface area despite minor variations in the gap spacing between the lips or ledges at 68 and 70. The dielectric 48 provides the spacing between the stubs 42b and the conductive surface on the inside surface of lip 68. The conductive surface on the inside of lip 68 acts as a ground plane, and, in the frequency range of interest, the open circuits of the microstrip lines provided by stubs 42b are transformed into low impedance paths between the stubs 42b and the ground plane at 68 in the vicinity of conductor 44b.

Similarly, the conductive surface on the inside of lip 70 acts as the ground plane for stubs 40b and, in the frequency range of interest, low impedance paths are provided between the stubs 40b and the ground plane at 70 in the vicinity of conductor 44b.

Thus, since conductor 44b joins the stubs 40b and 42b, the arrangement of the RF gasket in FIG. 3 is effective to provide a plurality of low impedance paths in the frequency range of interest, from conductive surface 64 to conductive surface 66 without a direct electrical contact between the two surfaces. These low impedance paths going all the way around the seam 26 have been found to be quite effective in reducing the flow of energy through the interface area of seams such as 26. This results from the fact that the low impedance paths create slots between paths which are short in the frequency range of interest and thus do not allow much leakage or radiation through the slots.

In the embodiment under consideration, the overall gasket has approximately a square cross section of one-eighth of an inch on a side. This cross section could have any shape depending upon the application and manufacturing technique used to make the gasket. The length of the gasket is determined by the length of the seam to be sealed off. Dimensions of this nature makes the gasket relatively easy to construct with known techniques while, at the same time, being small enough to be used in applications such as the one under consideration without requiring unusual tooling operations on the player outer shell.

FIG. 4 shows the player 20 of FIG. 1 where the RF gasket is used in three locations. A gasket 80 is used around the seam 26 as discussed before. In addition, a gasket 82 is used at the seam 30 on the top of the player and a gasket 84 is used along the top and bottom edges of the metal door 86 which is the caddy access door. Gasketing is not required on the short end sections of the door 86 since this dimension which is about 0.75 inches will allow only negligible radiation. Now it will be seen that the major seams of the player which might otherwise permit RF energy flow in the frequency range of interest have been effectively closed off with many low impedance paths between adjacent conductive surfaces.

FIG. 5 shows the video disc player 20 wherein a conductive inner box is used for RF shielding purposes. In this configuration RF gasket 90 seals off the upper and lower sections of the conductive box. In addition gasket 92 seals off the interface area between the carriage access lid 28 and a portion of the conductive box near the seam 30 and gasket 94 seals off the seam along the aforementioned edges of door 86 and a portion of the conductive inner box near opening 32.

A preferred gasket for use with a player having an enclosed conductive box such as that shown in FIG. 5, but, having generally straight edges around the various seams is shown in FIGS. 6–8.

In FIG. 6, neoprene strips 110 and 112 are placed along the bottom half of a gasket housing 114. The gasket housing bottom includes a raised step 116 having through holes 118 periodically positioned along the length of the step 116. An elongated strip of one mil Mylar having a plurality of stub pairs 120 connected by common conductive members 122 is positioned over the housing bottom 114. In this configuration, the stubs 120 and common connectors 122 are formed from one-half ounce copper and may be formed through known etching techniques. The common conductor members 122 are about 0.25 inches wide. The folded back stubs are 0.010 inches wide and occupy an area 0.375 inches wide and 0.090 inches above the members 122. The stub-to-stub spacing of the upper stubs is 0.75 inches from center to center. The copper side touches the neoprene and the Mylar is facing up.

In other arrangements, common conductive member 122 can be a continuous strip as shown in FIG. 2 if desired from a mechanical construction point of view.

Note in this configuration there is a first plurality of stubs (upper ones) and a second plurality of stubs (lower ones). The upper stubs will form low impedance paths to one portion of a conductive member of the enclosed conductive box, say the upper half of the box and the lower stubs will form a low impedance path to another portion of a conductive member of the enclosed conductive box, say the lower half of the box. The common conductive members 122 form the low impedance path between the upper stubs and the lower stubs. By separating the stub pairs (upper and lower) as shown, it is possible to locate the holes 118 as shown for mechanical purposes.

FIG. 7 shows the top half of the gasket housing 140. It is made from a plastic material and includes tapers 142, a step 144 and through holes 146 corresponding to holes 118 in the bottom half.

FIG. 8 shows the two halves of the RF gasket assembled. Fasteners are placed through the corresponding holes to form an elongated gasket strip. The gasket strip is then placed along the seam by inserting the upper portion of the conductive box, represented by 150, into the upper part of the gasket. The lower portion of the conductive box, represented by 152, is inserted in the lower part of the gasket.

The Mylar strip has the copper side facing the neoprene 110 and the Mylar strip can be secured to the neoprene and bottom half of the gasket using an adhesive. The Mylar strip is brought around the edges of the bottom half of the gasket and may be secured on the sides or back of the gasket with an adhesive. The neoprene is used so that its resiliency will take up any tolerance variations and thus press the Mylar side of the strip against the inserted conductor such as 150. The holes 118 may be eliminated by using other means to fasten 114 and 140 together, such as an adhesive, or ultrasonic welding.

The theory of operation is that radiation will normally be supported along the elongated dimension of seams. By using the gasket as shown in FIG. 8, the effect is the same as placing a plurality of short circuits between the upper part 150 and the lower part 152. This in turn has the effect of breaking up the seam into a plurality of short sections bounded by low impedance paths. The short sections do not readily support the propagation of energy in the frequency range of interest.

The general technique described above for breaking up elongated seams into short sections can also be used for the caddy door of FIG. 1 with a straight edged enclosed conductive box as described above. In this case, the upper plurality of stubs works with an upper portion of the enclosed conductive box in the caddy door region to form microstrip lines in accordance with the present invention. The lower plurality of stubs works with a lower portion of the enclosed conductive box in the caddy door region to form a second plurality of microstrip lines. The stub pairs are joined by common conductive members as shown in FIG. 6. The stub pairs and the respective common conductors are positioned on the caddy door itself. Thus, in this case, the common conductors are longer in the top to bottom dimension. Again, the net effect is to place a plurality of low impedance paths from the top of the caddy door opening to the bottom and these paths break up the elongated dimension of the caddy door opening (when the caddy door is in the closed position during record playback) into a plurality of short sections which will substantially reduce the ability of the caddy door opening to support the propagation of energy in the frequency band of interest.

It has been found experimentally that the RF gasket as shown in FIGS. 6-8 is relatively board band, i.e., it provides a reasonable degree of attenuation across a fairly broad band of frequencies. Thus, it is effective above and below the specific frequency of interest such as 915 MHz.

It will now be evident that the RF gasket of the present invention has many applications over and above that of video disc players. Such a gasket may, for example, be useful in closing off the seam around the door of a microwave oven. In fact, the gasket according to the present invention should be useful around any seam or interface area where there is concern about RF energy flow in a reasonable band of frequencies.

What is claimed is:

1. An RF gasket for providing electrical shielding in the interface area between two conductive surfaces without direct electrical contact between the two surfaces, said gasket being effective to substantially reduce the flow of energy, in a given frequency band, through said interface area, said gasket comprising:
   a first plurality of elongated conductive stub-like members;
   a second plurality of elongated conductive stub-like members;
   means for joining at least one stub member of said first plurality with at least one stub member of said second plurality;
   each stub-like member in said first and second plurality having one end connected to said joining means and the other end forming an open circuit, and further being folded back between said one end and said other end with said folding being such as to cause each of said folded open-circuited stub-like members to lie in a single plane;
   said gasket being adapted to be positioned in said interface area such that said first plurality of stubs is spaced from and substantially parallel to at least a portion of one conductive surface, and, said second plurality of stubs is spaced from and substantially parallel to at least a portion of said conductive surface;
   each of said stubs being dimensioned such that said open circuits are transformed into low impedance paths in said given frequency band when said gasket is placed in said interface area, said paths effectively occurring between said portion of one of said conductive surfaces and said one end of each stub in said first plurality, and between said portion of the other of said conductive surfaces and said one end of each stub in said second plurality.

2. An RF gasket for providing electrical shielding in the interface area between two conductive surfaces without direct electrical contact between the two surfaces, said gasket being effective to substantially reduce the flow of energy, in a given frequency band, through said interface area, said gasket comprising:
   a first plurality of elongated conductive stub-like members;
   a second plurality of elongated conductive stub-like members; and
   joining means for joining at least one stub member of said first plurality with at least one stub member of said second plurality to form a substantial U-shape;
   a resilient member positioned within said substantial U-shape;
   each stub-like member in said first and second plurality having one end connected to said joining means and the other end forming an open circuit and further being folded back between said one end and said other end;
   said gasket being adapted to be positioned in said interface area such that said first plurality of stubs is spaced from and substantially parallel to at least a portion of one conductive surface, and, said second plurality of stubs is spaced from and substantially parallel to at least a portion of said second conductive surface;
   each of said stubs being dimensioned such that said open circuits are transformed into low impedance paths in said given frequency band when said gasket is placed in said interface area, said paths effectively occurring between said portion of one of said conductive surfaces and said one end of each of each stub in said first plurality, and between said portion of the other of said conductive surfaces and said one end of each stub in said second plurality.

3. The RF gasket according to claim 2 further comprising a dielectric member covering the outside surface of said substantial U-shape.

4. The RF gasket according to claim 3 wherein each of said stubs in said first and second plurality have a length from one end to the other end approximately equivalent to an odd multiple of a quarter wavelength at a frequency in said given band.

5. The RF gasket according to claim 4 wherein said joining means comprises a plurality of conductors each one of which provides a low impedance path between at least one stub-like member of said first plurality and at least one stub-like member of said second plurality.

6. The RF gasket according to claim 4 wherein said joining means comprises a common conductive member connected to each stub-like member of said first and second plurality, said common conductive member forming a low impedance path between said first and second plurality of stub-like members.

7. An RF gasket for providing electrical shielding in the interface area between two conductive surfaces without direct electrical contact between the two surfaces, said gasket being effective to substantially reduce the flow of energy, in a given frequency band, through said interface area, said gasket comprising:

a first plurality of elongated, flat conductive stub-like members;

a second plurality of elongated, flat conductive stub-like members;

means for joining each stub member of said first plurality with a corresponding stub member of said second plurality;

each stub-like member in said first and second plurality having one end connected to said joining means and the other end forming an open circuit and each stub-like member being folded back at least once between said one end and said other end;

said first and second plurality of stubs and said joining means being positioned on a surface of an elongated, flat dielectric member to form a composite structure, said composite structure being formed into a substantial U-like shape with said stubs and said joining means on the inside of said substantial U-shape;

a resilient member substantially filling the inside volume of said U-shape;

said composite structure and said resilient member being adapted for positioning in proximity to at least a portion of each of said conductive surfaces with the outside surface of said dielectric member along the legs of said U-shape being adapted to respectively contact said portion of said first and said portion of said second conductive surfaces;

each of said stubs being dimensioned such that said open circuits are transformed into low impedance paths in said given frequency band, said paths effectively occurring between said portion of one of said conductive surfaces and said one end of each stub in said first plurality, and, between said portion of said other of said conductive surfaces and said one end of each stub in said second plurality.

8. The RF gasket according to claim 7 wherein said composite structure is symmetrically disposed about an axis along the elongated dimension of the dielectric member.

9. The RF gasket according to claim 8 wherein said dielectric member comprises a plastic strip.

10. The RF gasket according to claim 8 wherein said resilient member comprises neoprene foam-like material.

* * * * *